United States Patent
Shin et al.

(10) Patent No.: US 7,155,915 B2
(45) Date of Patent: Jan. 2, 2007

(54) TEMPERATURE CONTROLLER FOR A SEMICONDUCTOR-FABRICATING TOOL

(75) Inventors: Dong-Hwa Shin, Suwon-si (KR); Byong-Cheol Park, Suwon-si (KR); Sang-Ho Lee, Suwon-si (KR); Sung-Wook Park, Suwon-si (KR)

(73) Assignee: Samsung Electronics, Co., Ltd., Suwon (KR)

( * ) Notice: Subject to any disclaimer, the term of this patent is extended or adjusted under 35 U.S.C. 154(b) by 191 days.

(21) Appl. No.: 11/023,328

(22) Filed: Dec. 27, 2004

(65) Prior Publication Data

US 2005/0138935 A1    Jun. 30, 2005

(30) Foreign Application Priority Data

Dec. 26, 2003    (KR) ............... 10-2003-0097293

(51) Int. Cl.
*F25B 21/02*    (2006.01)
(52) U.S. Cl. ........................... 62/3.7; 62/259.2
(58) Field of Classification Search ................ 62/3.2, 62/3.3, 3.7, 259.2; 219/638; 165/80.5, 96, 165/185, 290
See application file for complete search history.

(56) References Cited

U.S. PATENT DOCUMENTS

| | | | | |
|---|---|---|---|---|
| 4,989,626 A | * | 2/1991 | Takagi et al. ............... 137/13 |
| 5,522,215 A | * | 6/1996 | Matsunaga et al. ........... 62/3.2 |
| 5,590,532 A | * | 1/1997 | Bachman ..................... 62/3.3 |
| 5,740,016 A | * | 4/1998 | Dhindsa ..................... 361/704 |
| 5,744,696 A | * | 4/1998 | Wang et al. ................. 73/23.25 |
| 5,871,859 A | * | 2/1999 | Parise ........................ 320/150 |
| 5,992,154 A | * | 11/1999 | Kawada et al. ............... 62/3.4 |
| 6,038,865 A | * | 3/2000 | Watanabe et al. ............. 62/3.6 |
| 6,555,936 B1 | * | 4/2003 | Tanaka et al. ................ 310/12 |
| 6,857,276 B1 | * | 2/2005 | Finn et al. .................... 62/3.7 |
| 6,992,306 B1 | * | 1/2006 | Honda et al. ............. 250/492.2 |

FOREIGN PATENT DOCUMENTS

| | | | |
|---|---|---|---|
| GB | 2330003 A | * | 4/1999 |
| JP | 9-133069 A | * | 5/1997 |
| JP | 10-242046 | | 9/1998 |
| JP | 2003-173958 | | 6/2003 |
| KR | 19980035985 | | 9/1998 |
| KR | 19990039395 | | 6/1999 |
| KR | 1020020017629 A | | 3/2002 |

OTHER PUBLICATIONS

English Abstract.
English Abstract.

* cited by examiner

*Primary Examiner*—Mohammad M. Ali
(74) *Attorney, Agent, or Firm*—F. Chau & Associates, LLC (57) ABSTRACT

A temperature controller for a semiconductor-fabricating tool includes a Peltier element disposed on an outer wall of the semiconductor-fabricating tool, and a battery for providing a current to the Peltier element. The Peltier element a heat-emitting plate for emitting heat by the current provided thereto, and a heat-absorbing plate for absorbing a heat. A first temperature sensor senses a temperature of the Peltier element. A second temperature sensor senses an interior temperature of the semiconductor-fabricating tool. A controller controls an amount of the current provided to the Peltier element in accordance with a temperature of the Peltier element sensed by the first temperature sensor and an interior temperature of the semiconductor-fabricating tool sensed by the second temperature sensor.

15 Claims, 7 Drawing Sheets

TEMPERATURE CONTROLLER FOR A SEMICONDUCTOR-FABRICATING TOOL

CROSS REFERENCE TO RELATED APPLICATION

This application claims priority under 35 USC § 119 to Korean Patent Application No. 2003-97293, filed on Dec. 26, 2003, the contents of which are herein incorporated by reference in its entirety for all purposes.

BACKGROUND OF THE INVENTION

1. Field of the Invention

The present invention relates to a temperature controller for a semiconductor-fabricating tool. More particularly, the present invention relates to a temperature controller for a semiconductor-fabricating tool such as a reticle box or a front opening unified pod (FOUP) that is used for fabricating a semiconductor device.

2. Description of Related Art

Semiconductor device development has increasing in importance with the widespread use of information devices such as computers. Semiconductor devices having increased operational speed and memory capacity are needed for the computers. Continued semiconductor device development needs a technology of manufacturing that has improved integration, reliability, response speed, etc. Photolithography is a technology that may be further developed for achieving improved integration of the semiconductor device.

When a semiconductor device is manufactured using a photolithography technology, a photoresist film on a wafer is exposed to form a photoresist pattern. A projection exposure apparatus may be used in the exposure process.

The projection exposure apparatus includes a light source, and a reticle on which a reticle pattern is formed. Light generated from the light source is irradiated to the reticle. The light penetrates the reticle to form a light pattern having a shape corresponding to that of the reticle pattern. The light pattern is transcribed onto the photoresist film on the wafer through a projection optical system, thereby forming the photoresist pattern.

The reticle includes a material through which the light can pass. The reticle pattern for forming the photoresist pattern is formed on the reticle. The reticle pattern may include chromium through which the light cannot pass. Slits through which the light penetrates are formed through the reticle pattern.

To prevent contamination of the reticle, a reticle box may be used for transferring the reticle to an exposure chamber. The exposure chamber is maintained at a temperature of about 22.0° C. A clean room in which the reticle box is positioned is maintained at a temperature of about 23.5° C. Thus, when the reticle is loaded into the exposure chamber from the reticle box, the reticle contracts due to a temperature difference of about 1.5° C. between the exposure chamber and the clean room. As a result, a line width between the reticle patterns is reduced so that the reticle pattern has a line width shorter than that determined in a design step. Therefore, when the exposure process is carried out using the reticle having a reduced line width, a photoresist pattern having a desired line width may not be formed.

Figure 1:
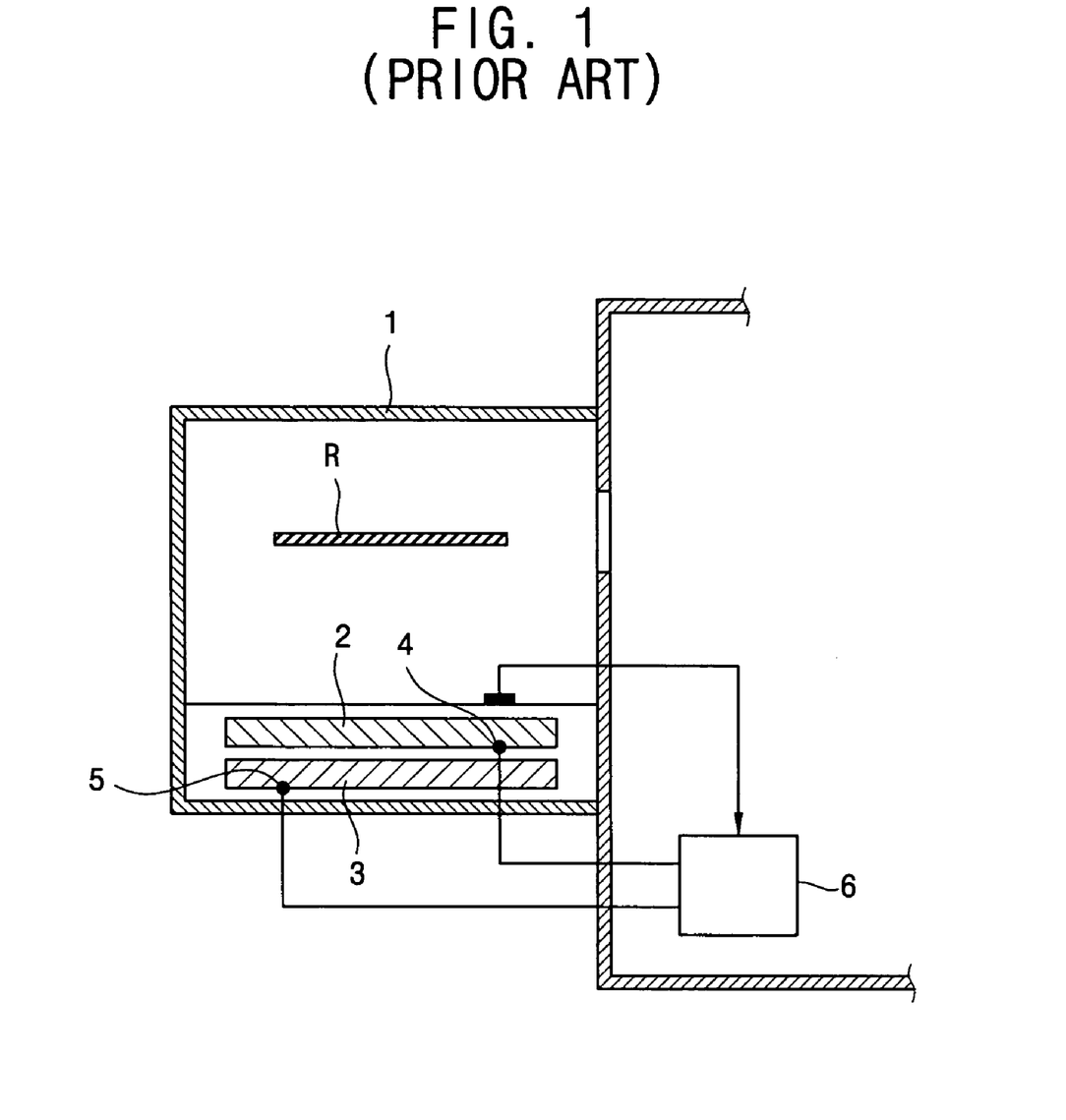
FIG. 1 is a cross sectional view illustrating a reticle box having a temperature controller.

A reticle box having a temperature controller is disclosed in Korean Patent Laid Open Publication No. 2002-0017629 and shown in FIG. 1. With reference to FIG. 1, a reticle R is received in a reticle box 1. A heating plate 2 for heating the reticle box 1 and a cooling plate 3 for cooling the reticle box 1 are disposed under the reticle box 1. Temperature sensors 4 and 5 are attached to the heating plate 2 and the cooling plate 3, respectively. A controller 6 controls operations of the heating plate 2 and the cooling plate 3 in accordance with temperatures of the heating plate 2 and the cooling plate 3 detected by the temperature sensors 4 and 5.

However, since the conventional temperature controller separately has a separate heating plate 2 and a separate cooling plate 3, the controller 6 may not accurately control the heating plate 2 and the cooling plate 3. Accordingly, since the temperature of the reticle box 1 is controlled by separate operations of the heating plate 2 and the cooling plate 3, precisely controlling the reticle box 1 may be very difficult.

Figure 7A:
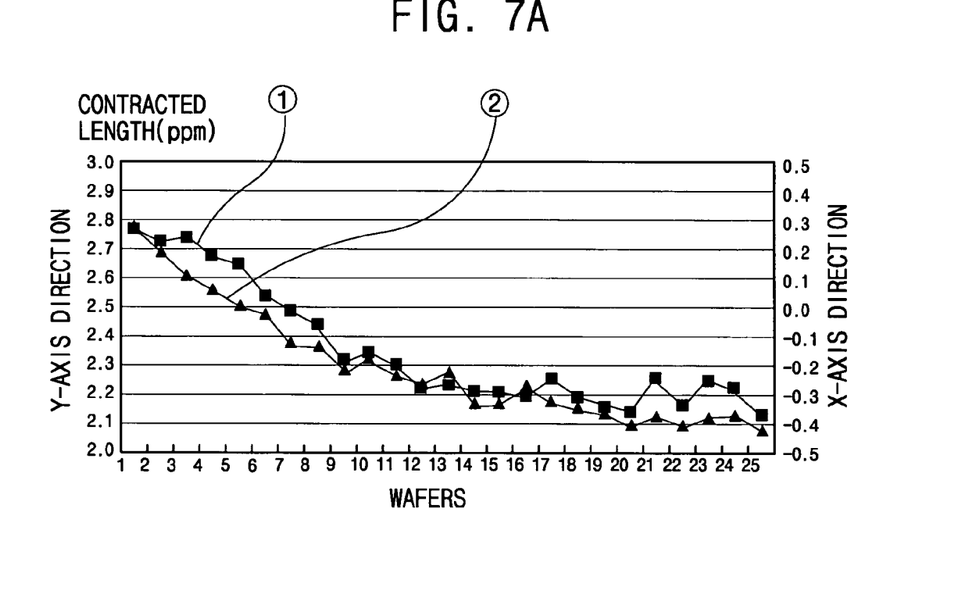
FIG. 7A is a graph illustrating contracted lengths of patterns on wafers that are formed using a reticle received in a reticle box without a temperature controller.

FIG. 7A is a graph illustrating contracted lengths of patterns on wafers that are formed using a reticle box without a temperature controller. In FIG. 7A, the horizontal axis represents wafers, the left vertical axis represent contracted lengths of the patterns with respect to the reticle patterns in a Y-axis direction, and the right vertical axis represents contracted lengths of the patterns with respect to the reticle patterns in an X-axis direction. Line ① indicates transitions of the contracted lengths of the patterns in the X-axis direction, and line ② indicates transitions of the contracted lengths of patterns in the Y-axis direction.

As shown in FIG. 7A, a pattern on a first wafer formed using the reticle contracted by about 0.3 ppm in the positive X-axis direction. A pattern on a fourteenth wafer contracted by about 0.3 ppm in the negative X-axis direction. A pattern on a twenty-fifth wafer contracted by about 0.4 ppm in the negative X-axis direction.

The pattern on the first wafer contracted by about 2.8 ppm in the Y-axis direction. The pattern on the fourteenth wafer contracted by about 2.3 ppm in the Y-axis direction. The pattern on the twenty-fifth wafer contracted by about 2.1 ppm in the Y-axis direction.

A line width of the reticle pattern contracted beyond a designed line width when the reticle in the reticle box having a temperature of about 23.5° C. was loaded into the exposure chamber that was maintained at a temperature of about 22° C. Therefore, the pattern on the first wafer that was formed using the reticle having the contracted line width also contracted in the X-axis and Y-axis directions. As the temperature of the IS reticle was raised to that of the exposure chamber, the pattern on the twenty-fifth wafer contracted within the designed line width.

According to FIG. 7A, a desired pattern might not be formed on a wafer by an initial exposure process in which the reticle in the reticle box has a temperature different from that of the exposure chamber.

Therefore, a need exists for a temperature controller for a semiconductor-fabricating tool having improved temperature control.

SUMMARY OF THE INVENTION

According to an embodiment of the present disclosure, a temperature controller controls a temperature within a semiconductor-fabricating tool.

A temperature controller for a semiconductor-fabricating tool in accordance with an embodiment of the present disclosure includes a Peltier element disposed on an outer wall of the semiconductor-fabricating tool, and a battery for providing a current to the Peltier element. The Peltier element includes a heat-emitting plate for emitting heat by the current provided thereto, and a heat-absorbing plate for absorbing heat. A first temperature sensor senses a temperature of the Peltier element. A second temperature sensor senses an interior temperature of the semiconductor-fabricating tool. A controller controls an amount of the current provided to the Peltier element in accordance with a temperature of the Peltier element sensed by the first temperature sensor and an interior temperature of the semiconductor-fabricating tool sensed by the second temperature sensor.

The semiconductor-fabricating tool comprises a reticle box having an inner box and an outer box. The Peltier element is attached to an outer wall of the inner box. The Peltier element comprises first and second heat-emitting plates electrically connected to the battery, a heat-absorbing plate electrically connected to the first and second heat-emitting plates, wherein the heat-absorbing plate is attached to the outer wall of the inner box for decreasing the interior temperature, and N-type and P-type semiconductor devices interposed between the heat-absorbing plate and the first and second heat-emitting plates.

The Peltier element comprises first and second heat-emitting plates electrically connected to the battery, wherein the first and second heat-emitting plates are attached to the outer wall of the inner box for increasing the interior temperature, a heat-absorbing plate electrically connected to the first and second heat-emitting plates, and N-type and P-type semiconductor devices interposed between the heat-absorbing plate and the first and second heat-emitting plates.

The semiconductor-fabricating tool comprises a front opening unified pod.

The battery is chargeable.

According to an embodiment of the present disclosure, a temperature controller for a reticle box that includes an inner box and an outer box, includes a Peltier element attached to an outer wall of the inner box of the reticle box, having first and second heat-emitting plates, a heat-absorbing plate, and N type and P type semiconductor devices interposed between the heat-absorbing plate and the first and second heat-emitting plates. A battery provides a current to the Peltier element. A first temperature sensor senses a temperature of the Peltier element. A second temperature sensor senses an interior temperature of the inner box. A controller controls an amount of the current provided to the Peltier element from the battery in accordance with the temperatures sensed by the first and second temperature sensors.

The first and second heat-emitting plates are attached to the outer wall of the inner box for increasing the interior temperature. The heat-absorbing plate is attached to the outer wall of the inner box for decreasing the interior temperature.

The temperature controller further comprises a monitor connected to the controller for controlling the current provided to the Peltier element.

According to an embodiment of the present disclosure, a temperature controller for a front opening unified pod (FOUP) includes a Peltier element attached to an outer wall of the FOUP, including first and second heat-emitting plates, a heat-absorbing plate, and N type and P type semiconductor devices interposed between the heat-absorbing plate and the first and second heat-emitting plates. A battery provides a current to the Peltier element. A first temperature sensor senses a temperature of the Peltier element. A second temperature sensor senses an interior temperature of the FOUP. A controller controls an amount of the current provided to the Peltier element from the battery in accordance with the temperatures sensed by the first and second temperature sensors.

The first and second heat-emitting plates are attached to the outer wall of the inner box for increasing the interior temperature. The heat-absorbing plate is attached to the outer wall of the inner box for decreasing the interior temperature.

The temperature controller further comprises a monitor connected to the controller for controlling the current provided to the Peltier element.

The temperature of the semiconductor-fabricating tool is controlled using the Peltier element that is capable of emitting the heat into the semiconductor-fabricating tool and discharging the heat from the semiconductor-fabricating tool, thereby accurately controlling the interior temperature of the semiconductor-fabricating tool such as the reticle box or the FOUP.

BRIEF DESCRIPTION OF THE DRAWINGS

The present invention will become more apparent by describing in detail exemplary embodiments thereof with reference to the attached drawings in which.

DETAILED DESCRIPTION OF PREFERRED EMBODIMENTS

The present invention will be described more fully hereinafter with reference to the accompanying drawings, in which preferred embodiments of the invention are shown.

Figure 2:
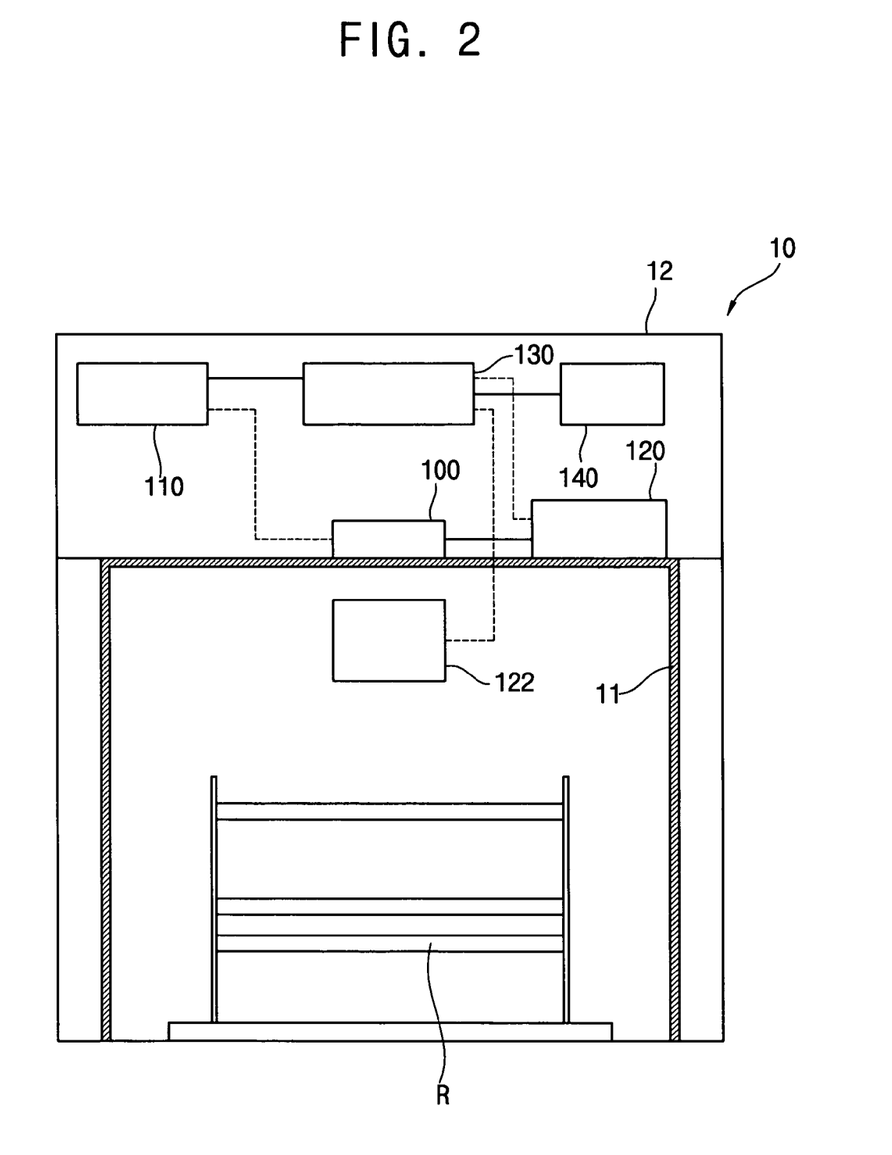
FIG. 2 is a cross sectional view illustrating a reticle box having a temperature controller in accordance with an embodiment of the present disclosure.

Referring to FIG. 2, a temperature controller in accordance with an embodiment of the present disclosure is used in conjunction with a reticle box 10 corresponding to a semiconductor-fabricating tool. The reticle box 10 includes an inner box 11 and an outer box 12. A reticle R is received in the inner box 11. The outer box 12 is disposed apart from the inner box 11 so that a space between the inner box 11 and the outer box 12 is formed.

The temperature controller is disposed in the space between the inner box 11 and the outer box 12. The temperature controller includes a Peltier element 100 attached to an upper outer wall of the inner box 11, and a battery 110 for providing a current to the Peltier element 100. The Peltier element 100 is capable of emitting heat and absorbing heat by the current provided to the Peltier element 100.

Figure 3:
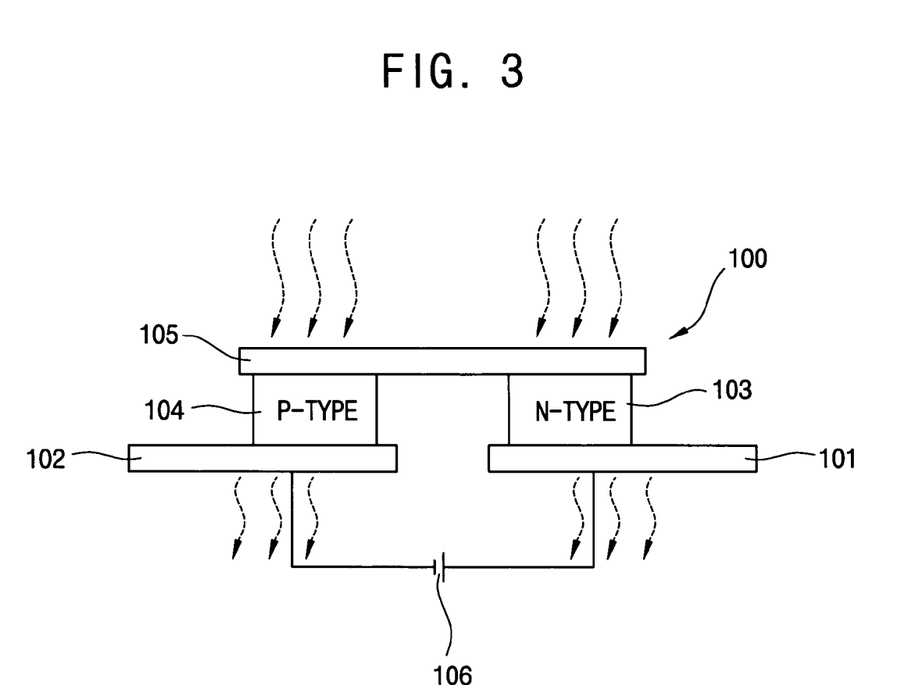
FIG. 3 is a cross sectional view illustrating a Peltier element used in the temperature controller in FIG. 2.

Referring to FIG. 3, the Peltier element 100 includes first and second heat-emitting plates 101 and 102, a heat-absorbing plate 105 opposite to the first and second heat-emitting plates 101 and 102, and N type and P type semiconductor devices 103 and 104 interposed between the heat-absorbing plate 105 and the first and second heat-emitting plates 101 and 102. A power supply 106, for example the battery 110 is electrically connected to the first and second heat-emitting plates 101 and 102.

A current is provided to the first heat-emitting plate 101 from the power supply 106. The current flows to the second heat-emitting plate 102 through the N type semiconductor device 103, the heat-absorbing plate 105 and the P type semiconductor device 104. Thus, the first and second heat-emitting plates 101 and 102 emit heat. The heat-absorbing plate 105 absorbs heat. This is due to the well-known Peltier effect.

The Peltier effect may be explained as a principle that an ideal gas is cooled by a constant entropy expansion. When an electron moves from a semiconductor having a high electron concentration to a semiconductor having a low electron concentration, an electron gas expands and then works with respect to a potential barrier between two plates having a substantially similar chemical potential, thereby electrically cooling an object. The Peltier effect can achieve a temperature difference of about 195° F. between the heat-emitting plates and the heat-absorbing plate.

When an interior temperature of the reticle box 10 is higher than that of an exposure chamber, the interior temperature of the reticle box 10 may be decreased. The heat-absorbing plate 105 is attached to an outer wall of the inner box 11 so that the first and second heat-emitting plates 101 and 102 are oriented away from the inner box 11. To raise the interior temperature of the reticle box 10, the first and second heat-emitting plates 101 and 102 are attached to the outer wall of the inner box 11 so that the heat-absorbing plate 105 is oriented away from the inner box 11.

The battery 110 provides the direct current to the Peltier element 100. The battery 110 may preferably be a chargeable type. Since the reticle box 10 is transported to various processing lots, the battery 110 is charged in the processing lots.

A first temperature sensor 120 is connected to the Peltier element 100. The first temperature sensor 120 senses temperatures of the first and second heat-emitting plates 101 and 102, and the heat-absorbing plate 105. A second temperature sensor 122 is disposed in the inner box 11. The second temperature sensor 122 senses the interior temperature of the inner box 11.

The temperature of the Peltier element 100 sensed by the first temperature sensor 120 and the interior temperature of the inner box 11 sensed by the second temperature sensor 122 are transmitted to a controller 130. The controller 130 controls an amount of current provided to the Peltier element 100 from the battery 110 in accordance with the temperatures of the Peltier element 100 and the inner box 11, thereby controlling heat-emitting and heat-absorbing operations of the Peltier 100.

A monitor 140 is connected to the controller 130. A worker monitors operations of the controller 130 through the monitor 140.

Figure 4:
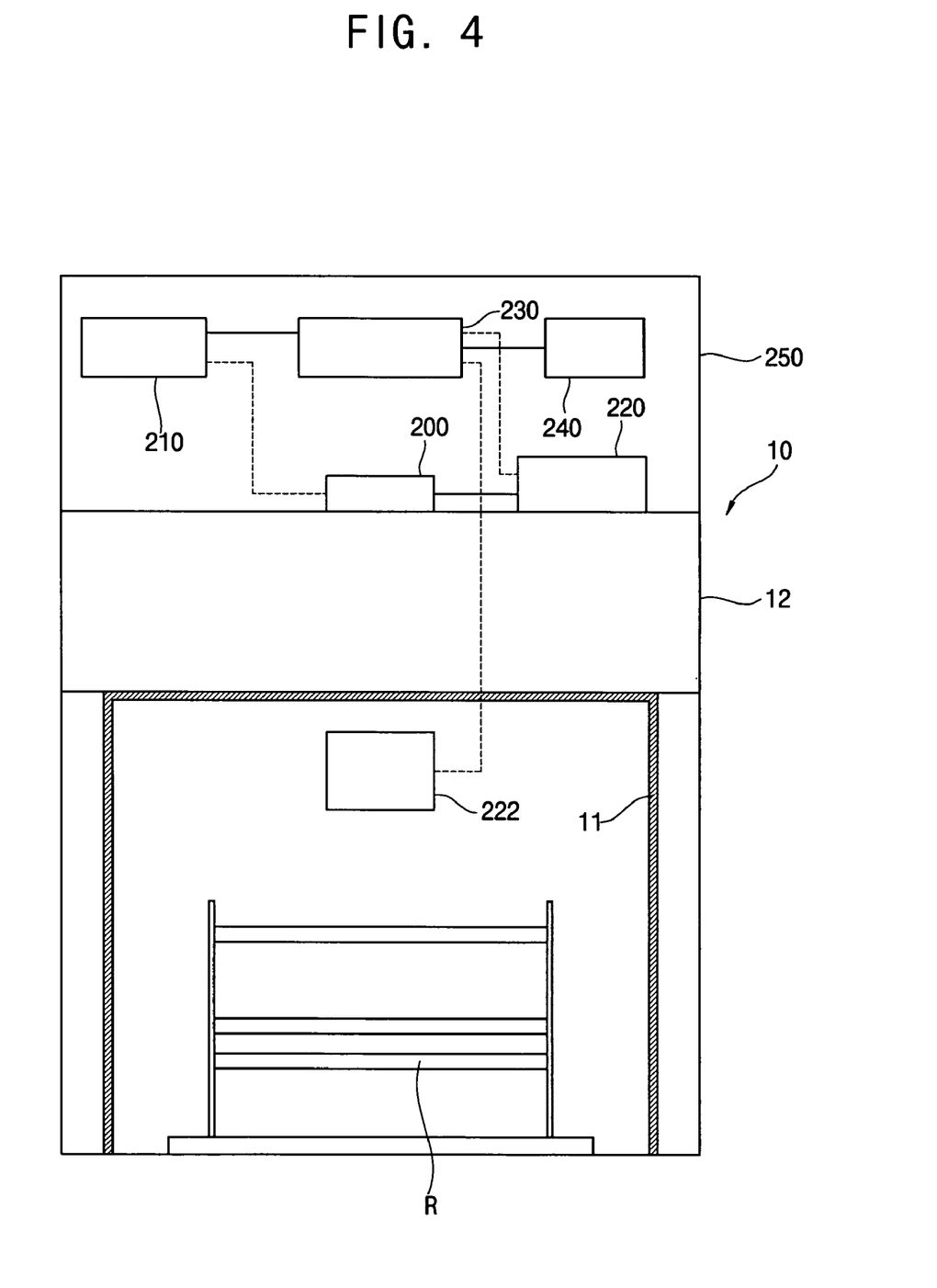
FIG. 4 is a cross sectional view illustrating a reticle box having a temperature controller in accordance with an embodiment of the present disclosure.

Referring to FIG. 4, a temperature controller in accordance with an embodiment of the present disclosure is used in conjunction with an outer box 12 of a reticle box 10. A Peltier element 200 is attached to an outer wall of the outer box 12. A battery 210 provides a direct current to the Peltier element 200.

A first temperature sensor 220 is connected to the Peltier element 200. A second temperature sensor 222 for sensing an interior temperature of an inner box 11 of the reticle box 10 is disposed in the inner box 11. Alternatively, the second temperature sensor 222 may be disposed in a space between the inner box 11 and the outer box 12.

A controller 230 controls an amount of current provided to the Peltier element 200 from the battery 210 in accordance with the temperatures sensed by the first and second temperature sensors 220 and 222, thereby controlling heat-emitting and heat-absorbing operations of the Peltier 200.

A monitor 240 is connected to the controller 230. A worker monitors operations of the controller 230 through the monitor 240.

Additionally, a cover 250 for protecting the temperature controller is mounted on the outer wall of the outer box 12.

A temperature controller in accordance with an embodiment of the present disclosure is employed in an FOUP.

To improve semiconductor device manufacturing productivity and device integration, wafer diameter has been increased and equipment has been automated. To manufacture more semiconductor devices from one wafer, a diameter of a wafer has increased, and semiconductor-fabricating equipment and process design have been developed for the larger wafers.

A carrier box receives a carrier having slots for receiving wafers. The carrier box is used for transporting the carrier and wafers. However, a wafer having a diameter of no more than 300 mm may be received in the FOUP having a carrier integrally formed with a carrier box.

Figure 5:
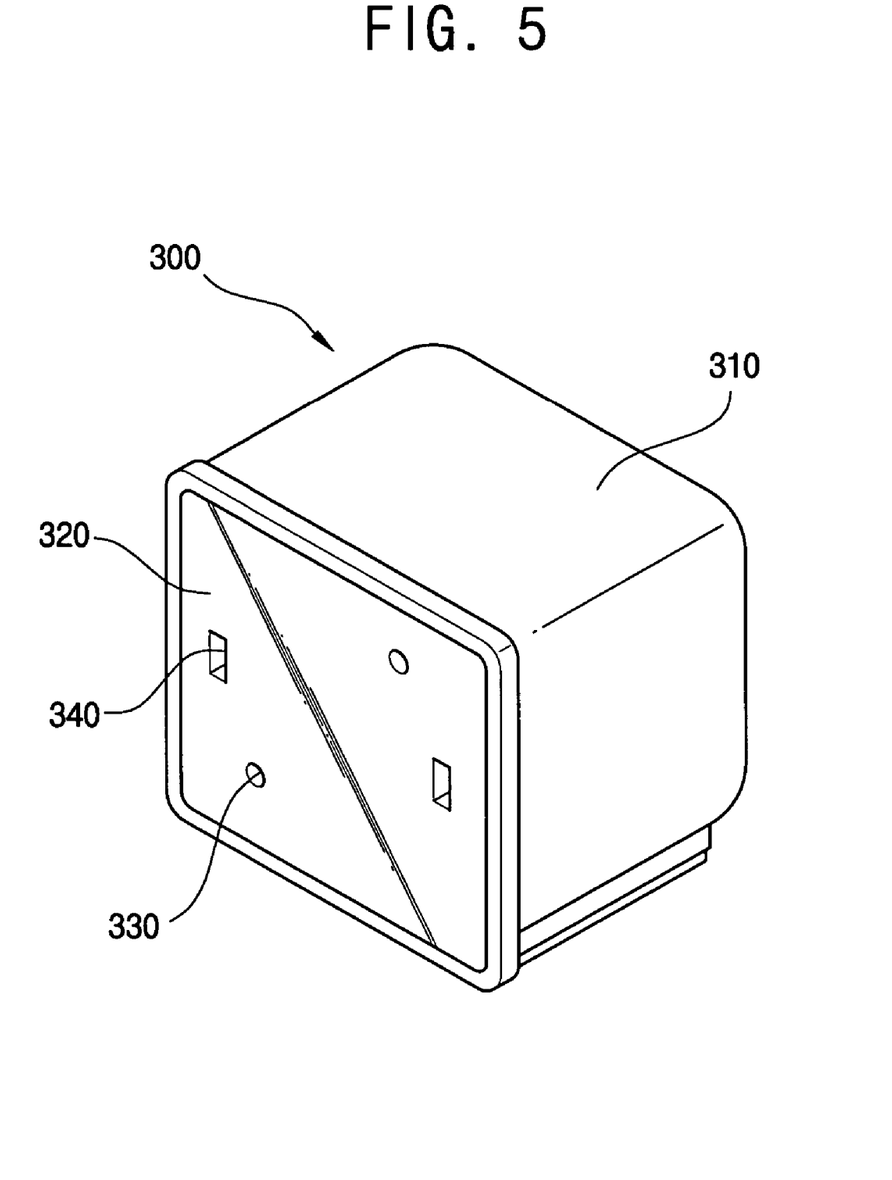
FIG. 5 is a cross sectional view illustrating a reticle box having a temperature controller in accordance with an embodiment of the present disclosure.

Referring to FIG. 5, the FOUP 300 includes a pod 310 in which a wafer is received, and a door 320 installed at a front side of the pod 310. Two registration-pin holes 330 and two latch holes 340 are formed through the door 320.

The FOUP 300 receiving the wafer is transported to various processing lots. When an interior temperature of a processing chamber disposed a processing lot is different from that of the FOUP 300, the wafer expands and contracts in loading/unloading the wafer. As a result, the wafer may be damaged. To prevent damage of the wafer, the temperature controller in accordance with an embodiment of the present disclosure is employed in the FOUP 300.

Figure 6:
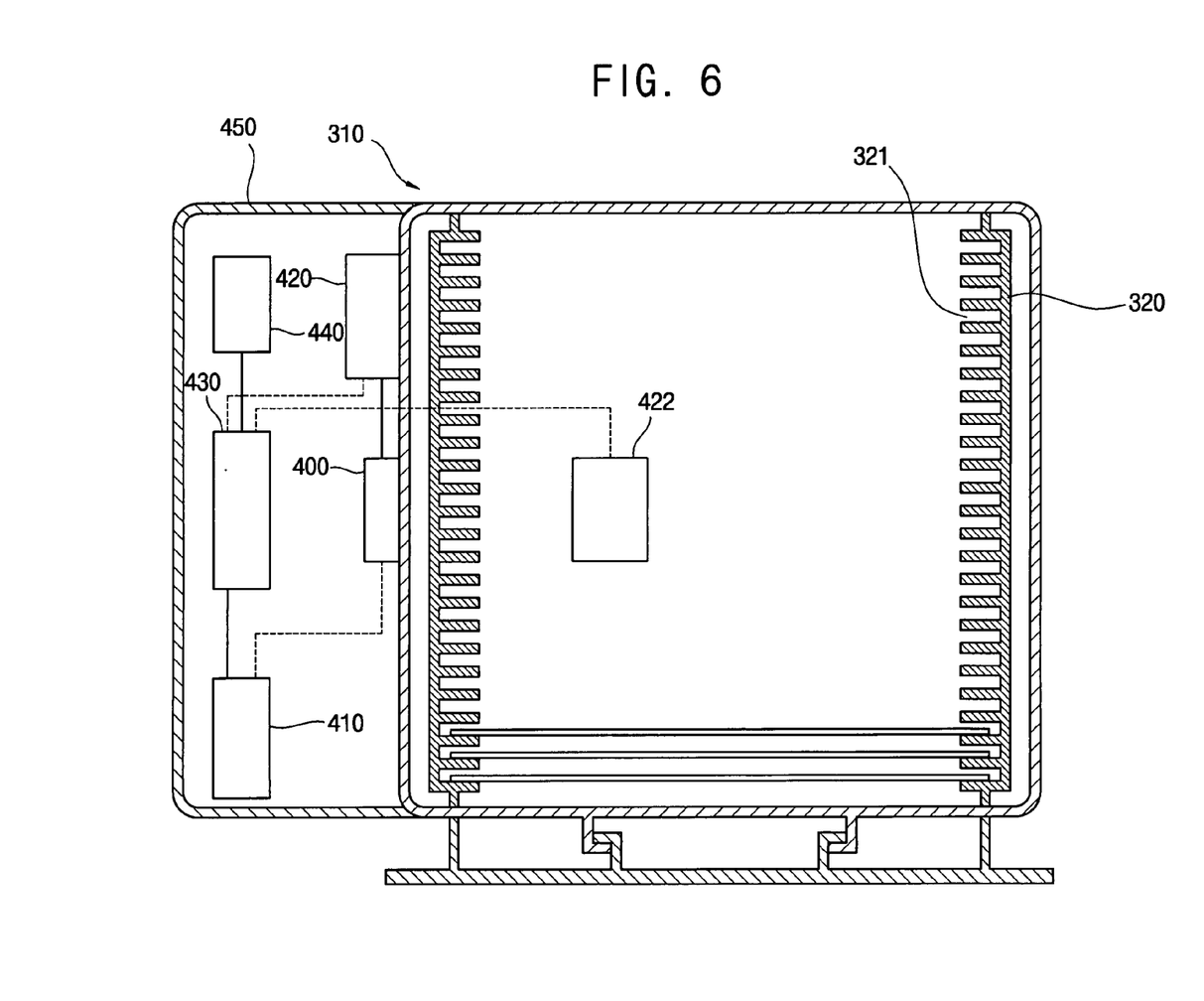
FIG. 6 is a cross sectional view illustrating an FOUP having the temperature controller in FIG. 5.

Referring to FIG. 6, a pair of wafer-receiving members 320 is disposed in the pod 310 of the FOUP 300. A plurality of slots 321 is formed at opposite side faces of the wafer-receiving member 320. The wafers are horizontally received in the slots 321.

The temperature controller includes a Peltier element 400, and a battery 410 for providing a current to the Peltier element 400. The Peltier element 400 is attached to an outer wall of the pod 310.

Positions of the Peltier element 400 are determined in accordance with the interior temperature of the processing chamber. When the interior temperature of the processing chamber is lower than that of the FOUP 300, the interior temperature of the FOUP 300 needs to be reduced. A heat-absorbing plate of the Peltier element 400 is attached to the FOUP 300 to reduce the interior temperature of the FOUP 300. When the interior temperature of the processing chamber is higher than that of the FOUP 300, the interior temperature of the FOUP 300 needs to be raised. The first and second heat-emitting plates of the Peltier element 400 are attached to the FOUP 300 to raise the interior temperature of the FOUP 300.

The battery 410 provides the direct current to the Peltier element 400. A first temperature sensor 420 is connected to the Peltier element 400. A second temperature sensor 422 is disposed in the FOUP 300. A controller 430 controls an amount of current provided to the Peltier element 400 from the battery 410 in accordance with the temperatures of the Peltier element 400 and the FOUP 300, thereby controlling heat-emitting and heat-absorbing operations of the Peltier 400.

A monitor 440 is connected to the controller 430. A worker monitors operations of the controller 430 through the monitor 440. Additionally, a cover 450 for protecting the temperature controller is mounted on the outer wall of the FOUP 300.

The temperature controller is employed in the reticle box and the FOUP in the above embodiments. The temperature controller may be employed in other semiconductor-fabricating tools such as a mask box or a stocker.

Referring to FIG. 7A, twenty-five wafers were sequentially exposed using a reticle that was loaded into an exposure chamber from a reticle box without a temperature controller to form patterns on the wafers corresponding to reticle patterns.

Figure 7B:
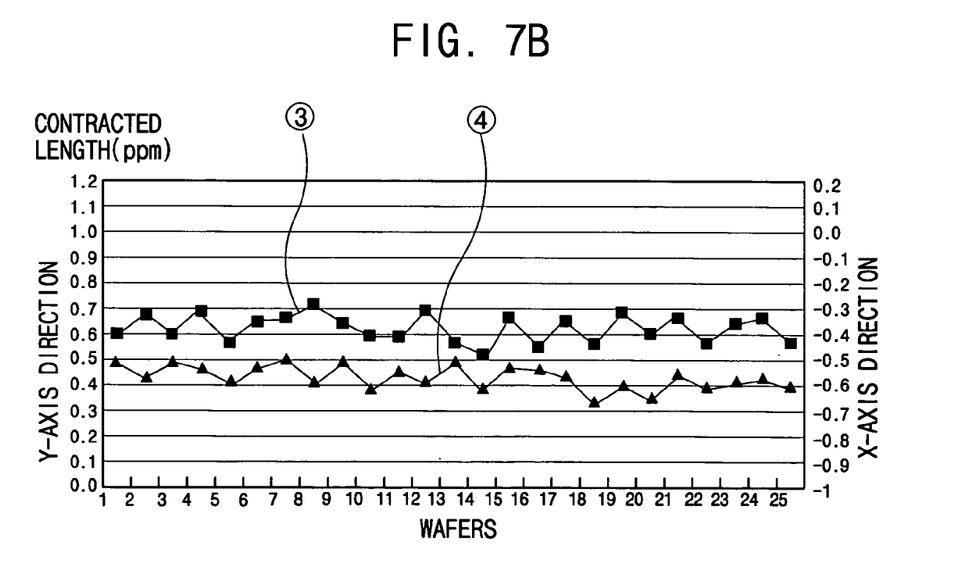
FIG. 7B is a graph illustrating contracted lengths of patterns on wafers that are formed using a reticle received in the reticle box in FIG. 2.

Referring to FIG. 7B, twenty-five wafers were sequentially exposed using a reticle that was loaded into an exposure chamber from a reticle box having the temperature controller in FIG. 2 to form patterns on the wafers corresponding to reticle patterns.

FIG. 7B is a graph illustrating contracted lengths of patterns on wafers formed using the reticle having the temperature controller. In FIG. 7B, the horizontal axis represents wafers, the left vertical axis represent contracted lengths of the patterns with respect to the reticle patterns in a Y-axis direction, and the right vertical axis represents contracted lengths of the patterns with respect to the reticle patterns in an X-axis direction. Line ③ indicates transitions of the contracted lengths of the patterns in the X-axis direction, and line ④ indicates transitions of the contracted lengths of patterns in the Y-axis direction.

As shown in FIG. 7B, a pattern on a first wafer formed using the reticle had a uniformly contracted length substantially similar to that of a pattern on a twenty-fifth wafer. In particular, the contracted lengths of the entire patterns were about 0.3 ppm to about 0.4 ppm in the negative X-axis direction. The contracted lengths of the entire patterns were about 0.4 ppm to about 0.5 ppm in the Y-axis direction.

The reticle pattern had a short contracted line width, when the reticle in the reticle box that was maintained at a temperature of about 23.5° C. substantially identical to that of the exposure chamber loaded into the exposure chamber. Therefore, the pattern on the first wafer that was formed using the reticle having the short contracted line width might not contract in the X-axis and Y-axis directions.

A desired pattern might be formed on a wafer by an exposure process in which the reticle in the reticle box has a temperature substantially identical to that of the exposure chamber was used.

According to an embodiment of the present disclosure, the interior temperature of the semiconductor-fabricating tool such as the reticle box or the FOUP may be accurately controlled using the Peltier element capable of performing the heat-emitting operation and the heat-absorbing operation.

The interior temperature of the reticle box may be controlled to correspond to that of the exposure chamber so that contraction of the reticle pattern may be prevented, thereby forming a desired pattern on a wafer.

Having described preferred embodiments of the present invention, it is noted that modifications and variations can be made by persons skilled in the art in light of the above teachings. It is therefore to be understood that changes may be made in particular embodiments of the present invention disclosed which is within the scope and the spirit of the invention outlined by the appended claims.

What is claimed is:

1. A temperature controller for a semiconductor-fabricating tool comprising:
   a Peltier element mounted on an outer wall of the semiconductor-fabricating tool, the Peltier element simultaneously emitting and absorbing heat;
   a battery for providing a current to the Peltier element;
   a first temperature sensor for sensing a temperature of the Peltier element;
   a second temperature sensor for sensing an interior temperature of the semiconductor-fabricating tool; and
   a controller for controlling an amount of the current provided to the Peltier element from the battery in accordance with the temperatures sensed by the first and second temperature sensors.

2. The temperature controller of claim 1, wherein the semiconductor-fabricating tool comprises a reticle box having an inner box and an outer box.

3. The temperature controller of claim 2, wherein the Peltier element is attached to an outer wall of the inner box.

4. The temperature controller of claim 3, wherein the Peltier element comprises:
   first and second heat-emitting plates electrically connected to the battery;
   a heat-absorbing plate electrically connected to the first and second heat-emitting plates, wherein the heat-absorbing plate is attached to the outer wall of the inner box for decreasing the interior temperature; and
   N-type and P-type semiconductor devices interposed between the heat-absorbing plate and the first and second heat-emitting plates.

5. The temperature controller of claim 3, wherein the Peltier element comprises:
   first and second heat-emitting plates electrically connected to the battery, wherein the first and second heat-emitting plates are attached to the outer wall of the inner box for increasing the interior temperature;
   a heat-absorbing plate electrically connected to the first and second heat-emitting plates; and
   N-type and P-type semiconductor devices interposed between the heat-absorbing plate and the first and second heat-emitting plates.

6. The temperature controller of claim 1, wherein the semiconductor-fabricating tool comprises a front opening unified pod.

7. The temperature controller of claim 1, wherein the battery is chargeable.

8. A temperature controller for a reticle box including an inner box and an outer box, comprising:
   a Peltier element attached to an outer wall of the inner box, including first and second heat-emitting plates, a heat-absorbing plate, and N-type and P-type semiconductor devices interposed between the heat-absorbing plate and the first and second heat-emitting plates;
   a battery for providing a current to the Peltier element;
   a first temperature sensor for sensing a temperature of the Peltier element;
   a second temperature sensor for sensing an interior temperature of the inner box; and
   a controller for controlling an amount of the current provided to the Peltier element from the battery in accordance with the temperatures sensed by the first and second temperature sensors.

9. The temperature controller of claim 8, wherein the first and second heat-emitting plates are attached to the outer wall of the inner box for increasing the interior temperature.

10. The temperature controller of claim 8, wherein the heat-absorbing plate is attached to the outer wall of the inner box for decreasing the interior temperature.

11. The temperature controller of claim 8, further comprising a monitor connected to the controller for controlling the current provided to the Peltier element.

12. A temperature controller for a front opening unified pod (FOUP) comprising:
   a Peltier element attached to an outer wall of the FOUP, including first and second heat-emitting plates, a heat-absorbing plate, and N-type and P-type semiconductor devices interposed between the heat-absorbing plate and the first and second heat-emitting plates;
   a battery for providing a current to the Peltier element;
   a first temperature sensor for sensing a temperature of the Peltier element;
   a second temperature sensor for sensing an interior temperature of the FOUP; and
   a controller for controlling the current provided to the Peltier element from the battery in accordance with the temperatures sensed by the first and second temperature sensors.

13. The temperature controller of claim 12, wherein the first and second heat-emitting plates are attached to the outer wall of the inner box for increasing the interior temperature.

14. The temperature controller of claim 12, wherein the heat-absorbing plate is attached to the outer wall of the inner box for decreasing the interior temperature.

15. The temperature controller of claim 12, further comprising a monitor connected to the controller for controlling the current provided to the Peltier element.

* * * * *